(12) United States Patent
Nagasawa et al.

(10) Patent No.: US 7,179,724 B2
(45) Date of Patent: Feb. 20, 2007

(54) WAFER PROCESSING METHOD

(75) Inventors: Tadato Nagasawa, Tokyo (JP); Yusuke Nagai, Tokyo (JP)

(73) Assignee: Disco Corporation, Tokyo (JP)

( * ) Notice: Subject to any disclaimer, the term of this patent is extended or adjusted under 35 U.S.C. 154(b) by 54 days.

(21) Appl. No.: 10/914,155

(22) Filed: Aug. 10, 2004

(65) Prior Publication Data

US 2005/0037541 A1 Feb. 17, 2005

(30) Foreign Application Priority Data

Aug. 12, 2003 (JP) ............... 2003-292190

(51) Int. Cl.
*H01L 21/00* (2006.01)
(52) U.S. Cl. .................................... 438/463
(58) Field of Classification Search ................ 438/463, 438/105
See application file for complete search history.

(56) References Cited

U.S. PATENT DOCUMENTS 6,936,497 B2 * 8/2005 Ravi et al. .................. 438/105
6,939,785 B2 * 9/2005 Kajiyama et al. ........... 438/463

FOREIGN PATENT DOCUMENTS

JP 2004-79889 3/2004

* cited by examiner

*Primary Examiner*—Carl Whitehead, Jr.
*Assistant Examiner*—Monica D. Harrison
(74) *Attorney, Agent, or Firm*—Smith, Gambrell & Russell, LLP

(57) ABSTRACT

A method of processing a wafer having devices in a plurality of areas sectioned by streets arranged in a lattice pattern on the front surface to form a metal film on a back surface thereof, wherein a laser beam application step for applying a laser beam capable of passing through a wafer, along the streets formed on the wafer to form a deteriorated layer is carried out before a metal film forming step for forming a metal film on the back surface of the wafer.

9 Claims, 7 Drawing Sheets

(a)

(b)

(a)

(b)

(a)

(b)

WAFER PROCESSING METHOD

FIELD OF THE INVENTION

The present invention relates to a method of processing a wafer which has individual semiconductor devices such as light emitting diodes or transistors, formed in a plurality of areas sectioned by dividing lines (streets) arranged in a lattice pattern on the front surface thereof.

DESCRIPTION OF THE PRIOR ART

The back surface of a wafer which has individual semiconductor devices such as light emitting diodes or transistors, formed in a plurality of areas sectioned by dividing lines (streets) arranged in a lattice pattern on the front surface thereof is ground so as to have a predetermined thickness and then, covered with a gold, aluminum or titanium metal film having a thickness of about 1 μm. The wafer having the metal film formed on the back surface is diced along the streets to be divided into individual devices. The thus obtained devices are widely used in electric equipment such as mobile telephones and personal computers. It is desired to make these devices as thin as possible (for example, 100 μm or less) for weight-saving and downsizing of electric equipment incorporating the devices.

To form the metal film on the back surface of the above wafer, a PVD (physical vapor deposition) device or CVD (chemical vapor deposition) device is used. Since the inside temperature of a sputter chamber is increased to a high temperature by the above metal film forming device when the metal film is formed on the back surface, if the thickness of the wafer is as thin as about 100 μm, its stiffness deteriorates and warp occurs, thereby making it difficult to form a metal film. Therefore, the metal film cannot be formed uniformly.

To solve the above problem, JP-A 2004-79889 proposes a process for manufacturing a wafer by bonding the front surface of the wafer to a protective member having high stiffness such as a glass substrate as a unitary structure, grinding the back surface of the wafer thus bonded to the protective member to a predetermined thickness and forming a metal film on the back surface of the wafer by a metal film forming device.

By the way, when the thickness of the wafer is reduced to about 100 μm, the wafer is cracked by heat in the sputter chamber at the time of forming a metal film on the back surface of the wafer by the metal film forming device, thereby deteriorating quality of the devices.

SUMMARY OF THE INVENTION

It is an object of the present invention to provide a wafer processing method capable of forming a metal film on the back surface of a wafer without deteriorating the quality of devices.

To attain the above objects, according to the present invention, there is provided a method of processing a wafer having devices in a plurality of areas sectioned by streets arranged in a lattice pattern on the front surface to form a metal film on a back surface thereof, wherein a laser beam application step for applying a laser beam capable of passing through a wafer, along the streets formed on the wafer to form a deteriorated layer is carried out before a metal film forming step for forming a metal film on the back surface of the wafer.

Further, according to the present invention, there is provided a method of processing a wafer having devices in a plurality of areas sectioned by streets arranged in a lattice pattern on the front surface, comprising a laser beam application step for applying a laser beam capable of passing through a wafer, along the streets formed on the wafer to form a deteriorated layer;

a back surface grinding step for grinding the back surface of the wafer having the deteriorated layer formed along the streets to a predetermined thickness; and a metal film forming step for forming a metal film on the back surface of the wafer.

Further, according to the present invention, there is provided a method of processing a wafer having devices formed in a plurality of areas sectioned by streets arranged in a lattice pattern on the front surface, comprising a back surface grinding step for grinding the back surface of the wafer to a predetermined thickness in a state of a protective member being bonded to the front surface of the wafer;

a laser beam application step for applying a laser beam capable of passing through a wafer, along the streets formed on the wafer to form a deteriorated layer; and a metal film forming step for forming a metal film on the back surface of the wafer.

Other features of the present invention will become apparent from the following description.

According to the present invention, since the laser beam application step for applying a laser beam capable of passing through a wafer, along the streets formed on the wafer is carried out before the metal film forming step for forming a metal film on the back surface of the wafer, even when a thermal shock acts on the wafer in the metal film forming step, it is cracked along the deteriorated layer having reduced strength and consequently, the devices are not damaged.

DETAILED DESCRIPTION OF THE PREFERRED EMBODIMENTS

The method of processing a wafer according to preferred embodiments of the present invention will be described hereinbelow with reference to the accompanying drawings.

Figure 1:
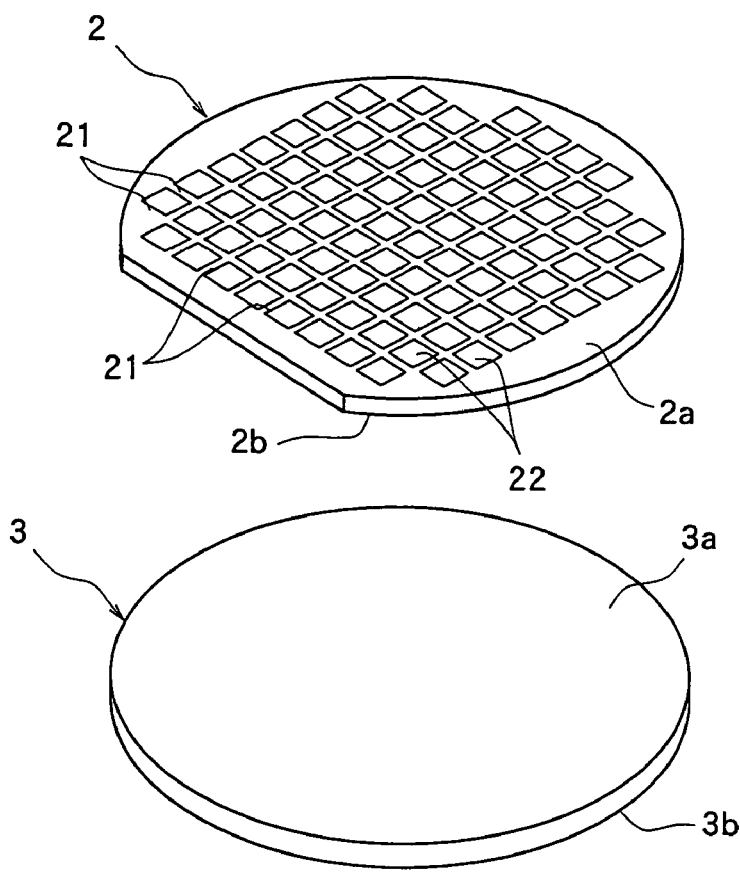
FIG. 1 is a perspective view of a wafer to be processed by the present invention and a protective member to be bonded to the wafer.

FIG. 1 shows a perspective view of a wafer to be divided according to the present invention and a protective member to be bonded to the wafer. The wafer 2 shown in FIG. 1 is formed in a round shape, a plurality of dividing lines (streets) 21 are formed on the front surface 2a of the wafer 2 in a lattice pattern, and individual semiconductor devices 22 are formed in a plurality of areas sectioned by the plurality of streets 21. The protective member 3 is formed in a disk-like shape and made of a material having high stiffness such as a glass substrate, and its front surface 3a and back surface 3b are flat. This protective member 3 preferably has a thickness of 1 to 3 mm when it is a glass substrate. As the material of the protective member 3, ceramics, metal materials such as stainless steel, resins and the like may be used besides glass.

Figure 2:
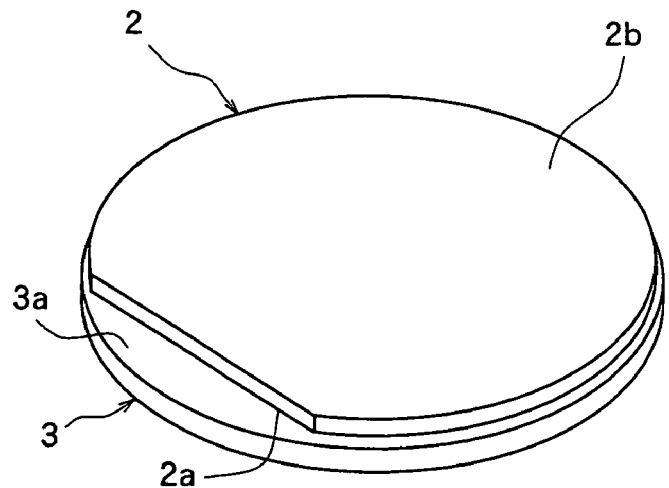
FIG. 2 is a perspective view showing a state of the wafer being bonded to the protective member, which are shown in FIG. 1.

The wafer 2 and the protective member 3 formed as described above are bonded to each other by an adhesive in such a manner that the front surface 3a of the protective member 3 and the front surface 2a of the wafer 2 are opposed to each other as shown in FIG. 2. Therefore, in the wafer 2, the back surface 2b having no individual semiconductor devices 22 has an exposed state. The adhesive is made of an acryl-based, ester-based or urethane-based resin. When a glass substrate is used as the protective member 3 and an adhesive whose adhesive strength can be reduced by ultraviolet radiation is used, it makes possible to remove the wafer 2 from the protective member 3 very easily because ultraviolet radiation can be applied to the adhesive through the protective member 3 at a later stage of removing the wafer 2 from the protective member 3.

Figure 3:
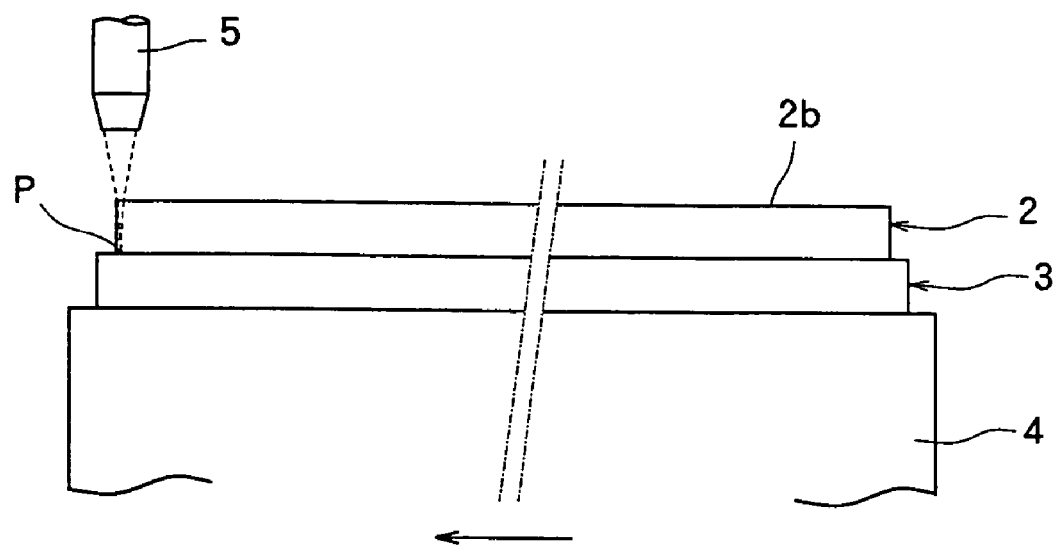
FIGS. 3(a) and 3(b) are explanatory diagrams showing the laser beam application step in the processing method of the present invention.
Figure 3:
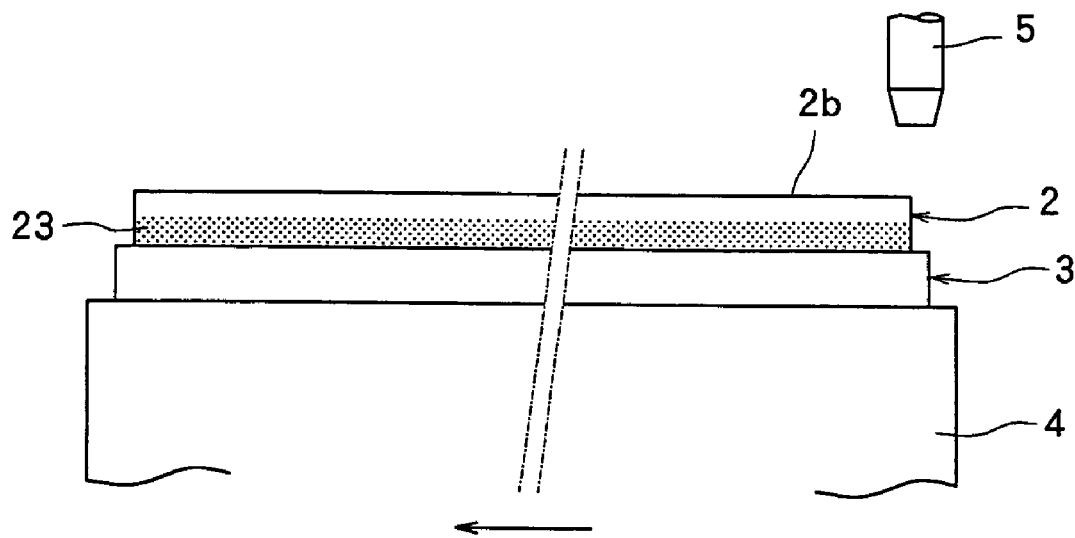

After the wafer 2 and the protective member 3 are bonded to each other by bonding them together as described above, a laser beam application step for applying a laser beam capable of passing through a wafer, along the streets 21 formed on the front surface 2a of the wafer 2 to form a deteriorated layer is carried out. That is, as shown in FIG. 3, the protective member 3 bonded to the wafer 2 is placed on the chuck table 4 of a laser beam processing machine and held on the chuck table 4 by a suction means that is not shown. After the protective member 3 bonded to the wafer 2 is held on the chuck table 4, the chuck table 4 is brought to a position right below an image pick-up means (not shown) to take an image of a street 21 formed on the wafer 2 so as to carry out alignment work. At this time, since the front surface 2a of the wafer 2 having the street 21 faces down, the image pick-up means which is constituted by an infrared camera applies infrared radiation passing through from the back surface 2b of the wafer 2 to take an image of the street 21. Then, as shown in FIG. 3(a), the chuck table 4 holding the wafer 2 is moved to a laser beam processing start position of a laser beam processing area to bring one end (left end in FIG. 3(a)) of the predetermined street 21 to the application position of laser beam application means 5.

After the chuck table 4, that is, the wafer 2 is thus positioned at the laser beam processing start position of the laser beam processing area, the chuck table 4, that is, the wafer 2 is moved in a direction shown by an arrow in FIG. 3(a) at a predetermined feed rate while a pulse laser beam capable of passing through a wafer is applied to the streets 21 from the laser beam application means 5. When the application position of the laser beam application means 5 reaches the other end (right end in FIG. 3(b)) of the street 21 as shown in FIG. 3(b), the application of the pulse laser beam is stopped and the movement of the chuck table 4, that is, the wafer 2 is also stopped. In this laser beam application step, the focusing point P of the pulse laser beam is set to the front surface 2a (surface on the lower side) of the wafer 2 to form a deteriorated layer 23 from the front surface 2a toward the inside of the wafer 2.

The above laser beam application step is carried out under the following processing conditions, for example.

Figure 4:
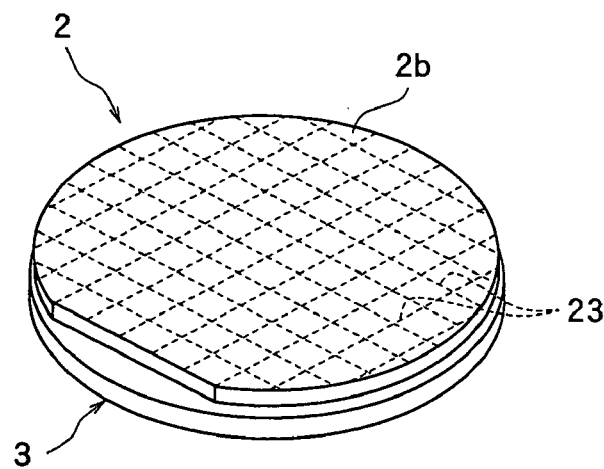
FIG. 4 is a perspective view of the wafer which has been subjected to the laser beam application step.

Light source: YVO4 laser or YAG laser
Wavelength: 1,064 nm
repetition frequency: 100 kHz
Pulse width: 25 ns
Focusing spot diameter: 1 μm
Processing Feed rate: 100 mm/sec By carrying out the above laser beam application step on all the streets 21 formed on the wafer 2, the deteriorated layer 23 is formed in the inside of the wafer 2 bonded to the protective member 3 along the streets 21, as shown in FIG. 4. The pulse laser beam may be applied so as to laminate the deteriorated layer 23 along the streets 21 in such a manner that it reaches the back surface 2b from the front surface 2a of the wafer 2.

Figure 5:
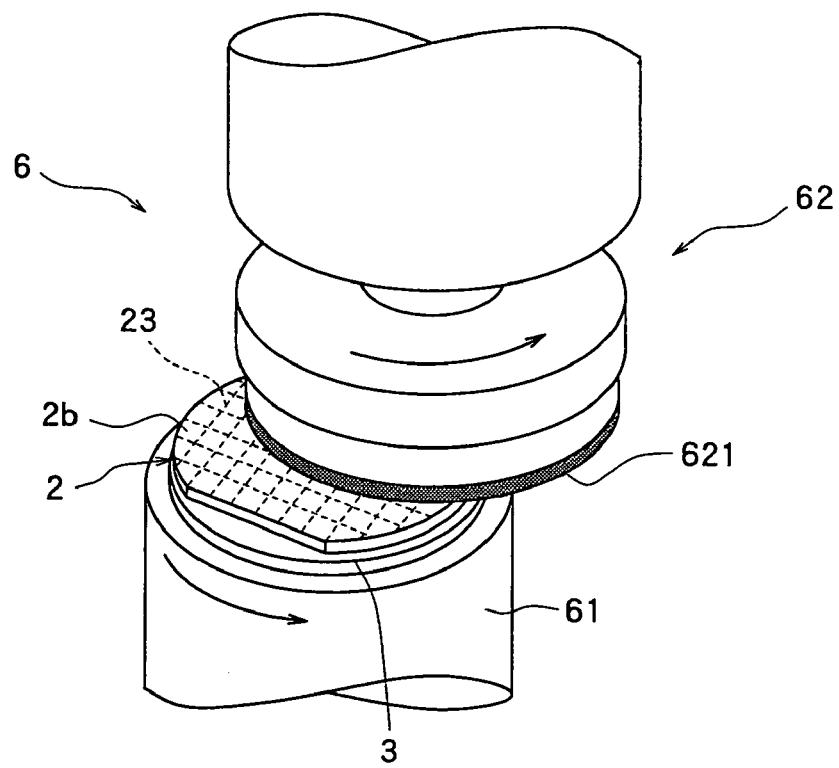
FIG. 5 is an explanatory diagram showing the back surface grinding step in the processing method of the present invention.

After the laser beam application step is carried out as described above, a back surface grinding step for grinding the back surface 2b of the wafer 2 in which the deteriorated layer 23 is formed along the streets 21, to a predetermined thickness is carried out. This back surface grinding step is carried out by a grinder 6 comprising a chuck table 61 and grinding means 62 having a grinding wheel 621 as shown in FIG. 5. That is, the wafer 2 bonded to the protective member 3 is held on the chuck table 61 in such a manner that the wafer becomes upward, and the grinding wheel 621 of the grinding means 62 is rotated at a revolution of 6,000 rpm, for example and brought into contact with the back surface 2b of the wafer 2 while the chuck table 61 is rotated at a revolution of 300 rpm, for example, to grind it so as to reduce the thickness of the wafer 2 to a predetermined value (for example, 100 μm).

Figure 6:
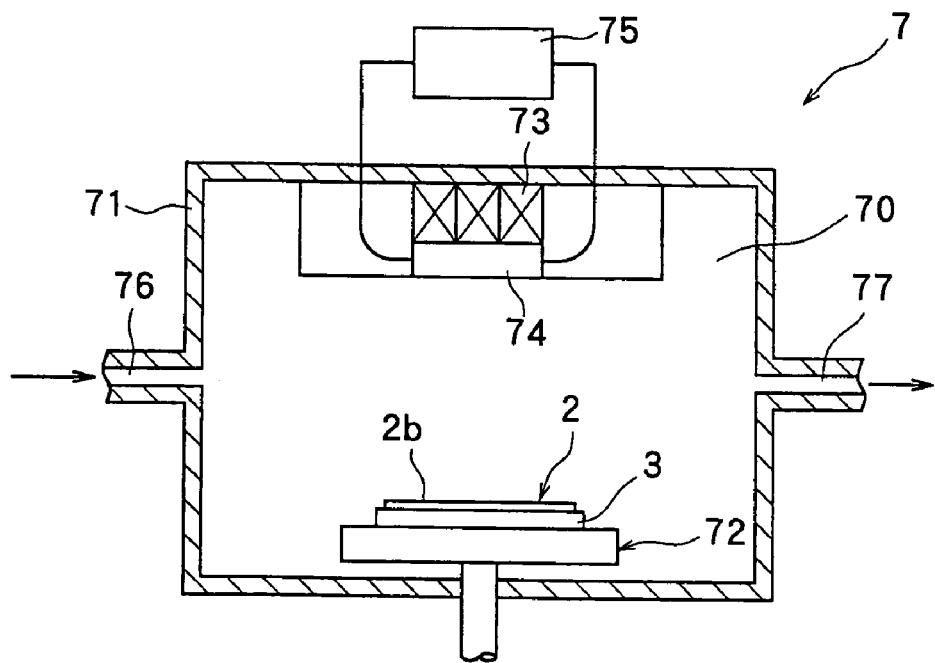
FIG. 6 is an explanatory diagram showing the metal film forming step in the processing method of the present invention.

After the back surface grinding step is carried out as described above, a metal film forming step for forming a metal film on the back surface 2b of the wafer 2 is carried out. A thin film forming device is used to carry out the metal film forming step. A PVD (Physical Vapor Deposition) device or CVD (Chemical Vapor Deposition) device can be used as the thin film forming device. The thin film forming device will be described below with reference to FIG. 6. The thin film forming device shown in FIG. 6 comprises a sputter box 71 for forming a sputter chamber 70. In the sputter chamber 70, a workpiece holding means 72 for holding a workpiece electrostatically is disposed in the lower portion thereof and an excitation means 73 opposed to the workpiece holding means 72 is disposed in the upper portion thereof. A sputter source 74 such as gold (Au) or the like is supported by the excitation means 73 and is connected to a high-frequency power source 75. An introduction port 76 for introducing a sputter gas such as argon gas or the like into the sputter chamber 70 is provided in one side wall of the sputter tank 71 and a pressure reducing port 77 communicating with a pressure reducing source is formed in the other side wall of the sputter tank 71.

Figure 7:
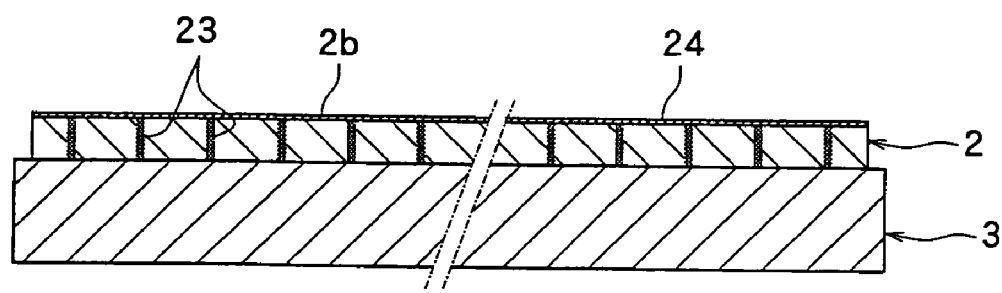
FIG. 7 is an enlarged sectional view of the wafer that has been subjected to the metal film forming step.

The wafer 2 bonded to the protective member 3 is held on the workpiece holding means 72 of the thin film forming device 7 constituted as described above in such a manner that the wafer 2 becomes upward. A high-frequency power of about 40 kHz is applied from the high-frequency power source 75 to the sputter source 74 magnetized by the excitation means 73, the inside pressure of the sputter chamber 70 is reduced to about $10^{-2}$ Pa to $10^{-4}$ Pa through the pressure reducing port 77, and a sputter gas such as argon gas or the like is introduced from the introduction port 76 into the sputter chamber 70 to generate plasma. As a result, argon ions contained in the plasma come into collision with gold (Au) as the sputter source 74 to produce particles which are then deposited on the back surface 2b of the wafer 2 held on the workpiece holding means 72, thereby forming a gold thin film 24 as thick as about 1 μm as shown in FIG. 7. Since the inside temperature of the sputter chamber 70 becomes very high in the metal film forming step, there is a possibility that the wafer 2 formed as thin as about 100 μm may be cracked by a heat shock. In the present invention, however, the deteriorated layer 23 has been formed along the streets 21 in the inside of the wafer 2 in the above-described laser beam application step and the deteriorated layer has reduced strength. Therefore, cracks are produced along the deteriorated layer 23 having reduced strength, that is, the streets 21 in the wafer 2, whereby the individual semiconductor devices 22 are not damaged. Even when the wafer 2 is cracked along the deteriorated layer 23, that is, the streets 21, the metal film closely adheres to the wafer 2 and hence, the metal does not enter the crack in the metal film forming step.

Figure 8:
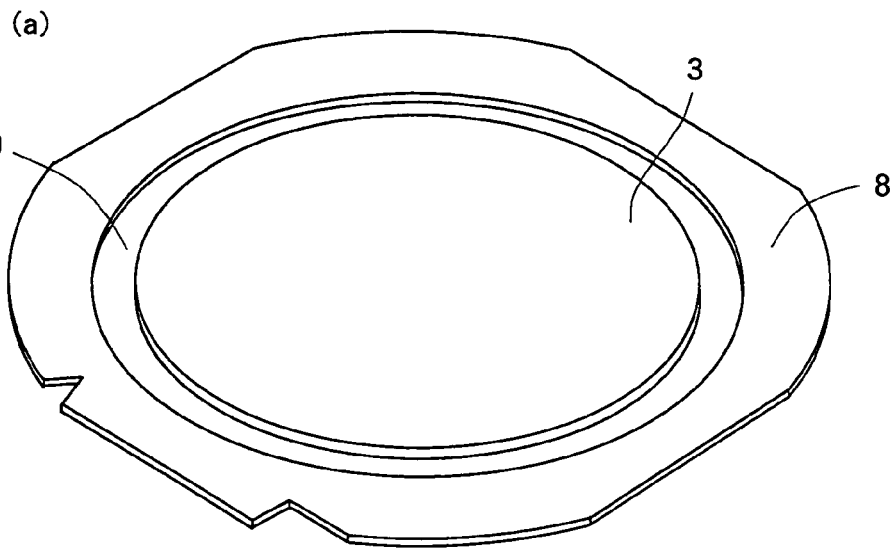
FIGS. 8(a) and 8(b) are explanatory diagrams showing the dicing tape affixing step in the processing method of the present invention.
Figure 8:
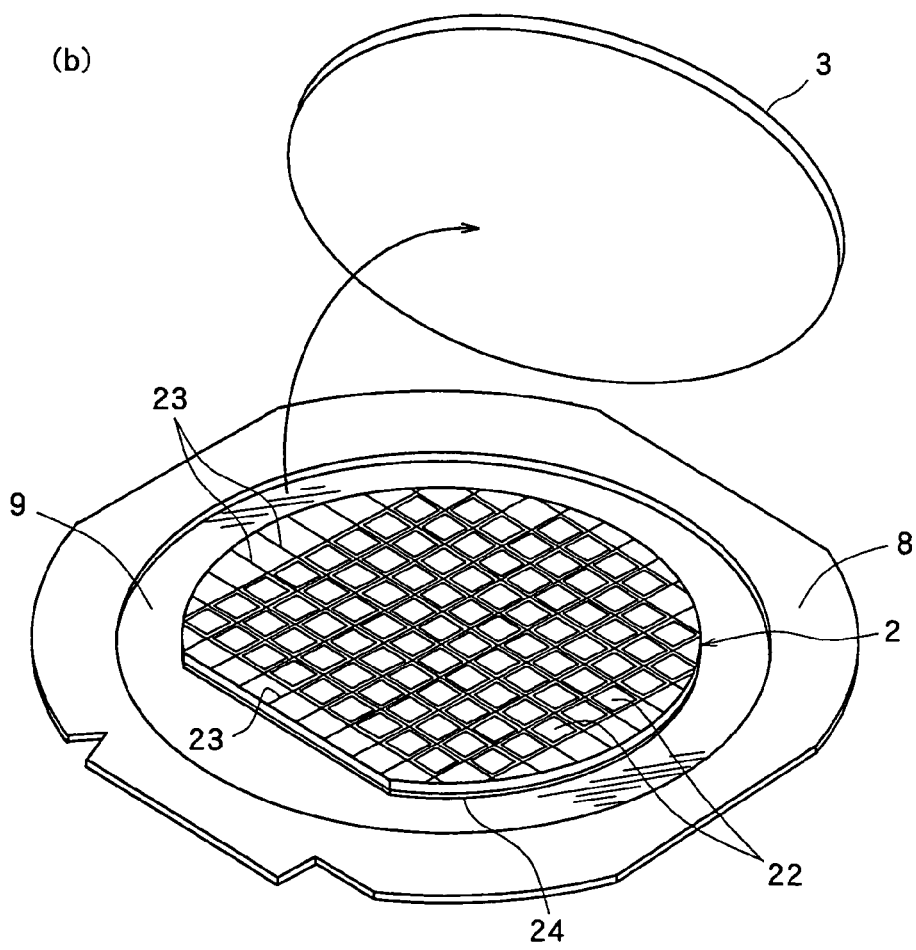

After the metal film forming step is carried out as described above, a dicing tape affixing step for putting the wafer 2 having the metal thin film 24 formed on the back surface 2b to a dicing tape and removing the protective member 3 bonded to the wafer 2 is carried out. In this dicing tape affixing step, the wafer 2 bonded to the protective member 3 is put onto the elastic dicing tape 9, which is a vinyl chloride tape and the like and mounted so as to cover the inner opening of an annular support frame 8, as shown in FIG. 8(a). That is, the dicing tape 9 is affixed on the side of the metal thin film 24 formed on the back surface 2b of the wafer 2. As the dicing tape 9, a UV tape whose adhesive strength is reduced by an external stimulus such as ultraviolet radiation or the like is preferably used. After the wafer 2 bonded to the protective member 3 is put to the dicing tape 9, the protective member 3 is removed as shown in FIG. 8(b). On this occasion, when a glass substrate is used as the protective member 3, the protective member 3 can be removed from the wafer 2 very easily by applying ultraviolet radiation passing through the protective member 3 to the adhesive.

After the above dicing tape affixing step has been carried out, a semiconductor device dividing step for dividing the wafer 2 into individual semiconductor devices 22 is carried out. This semiconductor device dividing step is carried out by a pick-up device 10 shown in FIG. 9 and FIGS. 10(a) and 10(b). The pick-up device 10 will be described hereinbelow. The illustrated pick-up device 10 comprises a cylindrical base 11 having a placing surface 111 for placing the support frame 8 and an expansion means 12, which is installed in the base 11 concentrically and works for expanding the dicing tape 9 mounted on the support frame 8. The expansion means 12 comprises a cylindrical expansion member 121 for supporting the area 91 where the wafer 2 exists, in the above dicing tape 9. This expansion member 121 is so constituted as to be moved in the vertical direction (in the axial direction of the cylindrical base 11) between a reference position shown in FIG. 10(a) and an expansion position shown in FIG. 10(b) above the reference position by a lifting means that is not shown. In the illustrated embodiment, ultraviolet lamps 113 are installed in the expansion member 121.

The semiconductor device dividing step which is carried out by using the above pick-up device will be described with reference to FIG. 9 and FIGS. 10(a) and 10(b).

Figure 9:
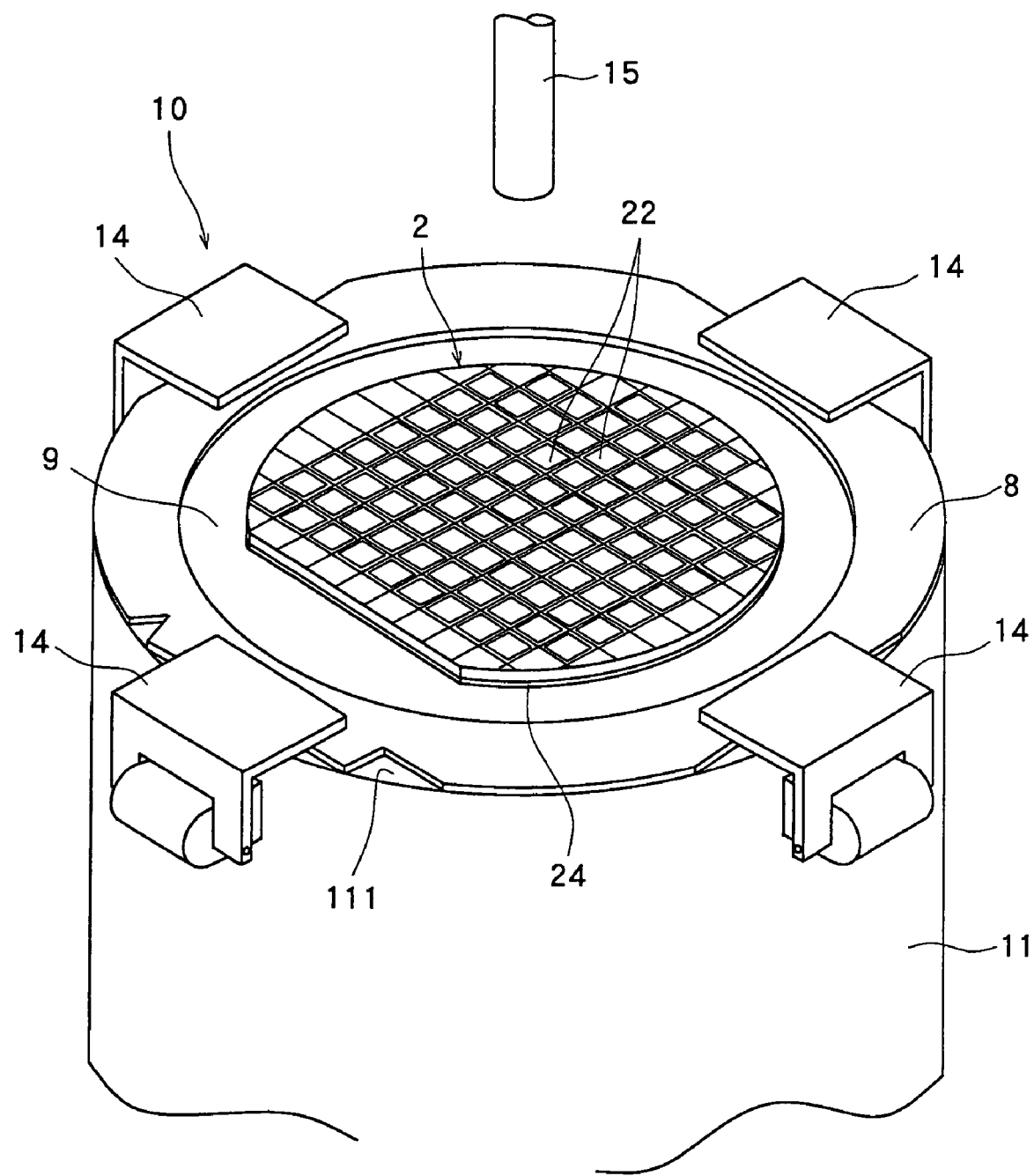
FIG. 9 is a perspective view of a pick-up device used in the device dividing step in the processing method of the present invention.
Figure 10:
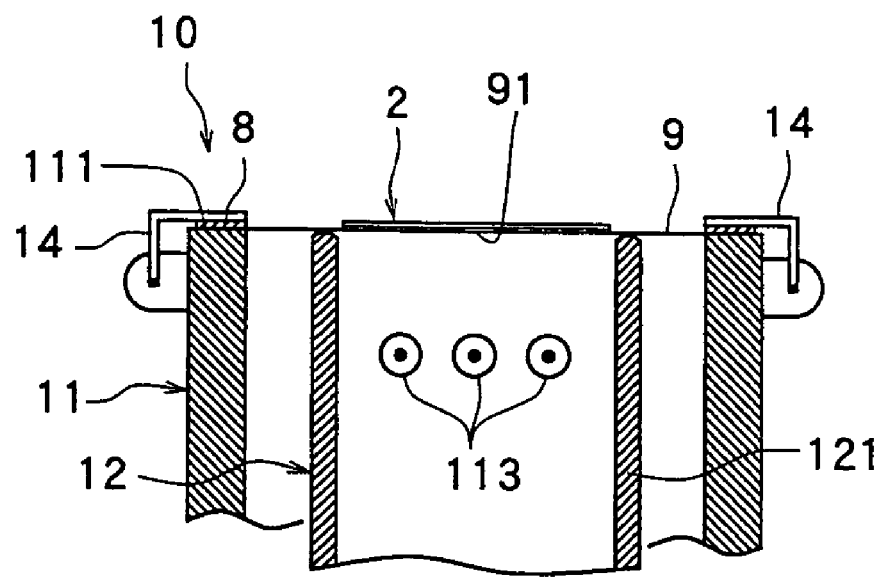
FIGS. 10(a) and 10(b) are explanatory diagrams showing the device dividing step in the processing method of the present invention.
Figure 10:
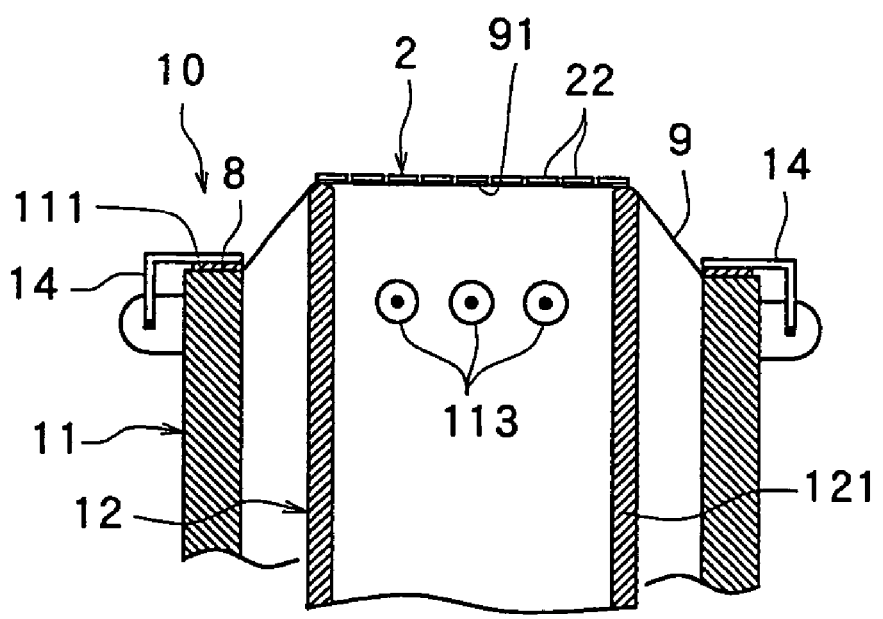

As for the wafer 2 supported on the top surface of the elastic dicing tape 9 mounted on the support frame 8 as described above, the support frame 8 is placed on the placing surface 111 of the cylindrical base 11 and secured on the base 11 by clamps 14 as shown in FIG. 9 and FIG. 10(a). Then, the expansion member 121 of the expansion means 12 supporting the area 91 where the wafer 2 exists, in the above dicing tape 9 is moved to the expansion position shown in FIG. 10(b) from the reference position shown in FIG. 10(a) by the lifting means that is not shown. As a result, the elastic dicing tape 9 is expanded so that tensile force is exerted on the wafer 2 mounted on the dicing tape 9. Consequently, the wafer 2 is divided along the streets 21 whose strength has been reduced due to the formation of the deteriorated layer, and the metal thin film 24 formed on the back surface 2b of the wafer 2 is also divided along the streets 21. Before the dicing tape 9 is expanded, it is desirable that the dividing along the streets 21 is promoted by giving a heat shock generated by applying a laser beam (continuous wave) or supersonic vibration to the streets 21 of the wafer 2.

Thereafter, the individual semiconductor devices 22 separated from one another are picked up from the top surface of the dicing tape 9 by activating a pick-up collet 15 positioned above the pick-up device 10 as shown in FIG. 9 and carried to a tray that is not shown. At this point, the ultraviolet lamps 113 installed in the expansion member 121 are turned on to apply ultraviolet radiation to the dicing tape 9 so as to reduce the adhesive strength of the dicing tape 9, thereby making it possible to pick up the semiconductor devices 22 very easily.

The method of processing a wafer according to an embodiment of the present invention has been described above. Various modifications maybe made on each step. For example, the above laser beam application step can be carried out without bonding the wafer 2 to the protective member 3. That is, a laser beam capable of passing through a wafer may be applied to the wafer 2 along the streets 21 from the back surface 2b side or the front surface 2a side in a state of the wafer that is not bonded to a protective member, to form the deteriorated layer 23 in the inside of the wafer 2. After the laser beam application step is thus carried out and then the front surface 2a of the wafer 2 is bonded to the protective member 3, the above back surface grinding step may be carried out. That is, the step of integrating the wafer 2 with the protective member 3 by bonding the front surface 2a of the wafer 2 to the protective member 3 may be carried out before the back surface grinding step. Further, in the above embodiment, the back surface grinding step is carried out after the laser beam application step. However, after the back surface grinding step is carried out to reduce the thickness of the wafer 2 to a predetermined value, the laser beam application step may be carried out.

Further, after the above laser beam application step has been carried out, it is possible that the wafer dividing step for cracking the wafer 2 along the deteriorated layer 23 formed in the inside of the wafer 2 along the streets 21 in a state of the protective member 3 being bonded to the front surface 2a of the wafer 2 be carried out. In this wafer dividing step, the wafer 2 is positively cracked along the deteriorated layer 23 having reduced strength by giving a stimulus of supersonic vibration or a heat shock by applying a laser beam (continuous wave) to the wafer 2. The wafer dividing step may be carried out before the above back surface grinding step, or before or after the above metal thin film forming step if it is after the laser beam application step has been carried out. By cracking the wafer 2 along the deteriorated layer 23 positively, the metal thin film 24 formed on the back surface 2b of the wafer 2 can be easily divided in the above semiconductor device dividing step.

We claim:

1. A method of processing a wafer having devices in a plurality of areas sectioned by streets arranged in a lattice pattern on the front surface to form a metal film on a back surface thereof, wherein
   a laser beam application step for applying a laser beam capable of passing through a wafer, along the streets formed on the wafer to form a deteriorated layer is carried out before a metal film forming step for forming a metal film on the back surface of the wafer, the laser beam application step comprising applying the laser beam from the back surface of the wafer.

2. The method of processing a wafer according to claim 1, which comprises a device dividing step for dividing the wafer having a metal film formed on the back surface along the deteriorated layer after the metal film forming step.

3. A method of processing a wafer having devices in a plurality of areas sectioned by streets arranged in a lattice pattern on the front surface, comprising
   a laser beam application step for applying a laser beam capable of passing through a wafer, along the streets formed on the wafer to form a deteriorated layer, the laser beam application step comprising applying the laser beam from the back surface of the wafer;
   a back surface grinding step for grinding the back surface of the wafer having the predetermined layer formed along the streets to a predetermined thickness; and
   a metal film forming step for forming a metal film on the back surface of the wafer.

4. The method of processing a wafer according to claim 3, which comprises the step of affixing a protective tape to the front surface of the wafer before the back surface grinding step.

5. The method of processing a wafer according to claim 4 which comprises a wafer dividing step for cracking the wafer along the deteriorated layer by giving a stimulus to the wafer in a state of the protective member being bonded to the front surface of the wafer after the laser beam application step.

6. The method of processing a wafer according to claim 3, which comprises a device dividing step for dividing the wafer having a metal film formed on the back surface along the deteriorated layer after the metal film forming step.

7. A method of processing a wafer having devices formed in a plurality of areas sectioned by streets arranged in a lattice pattern on the front surface, comprising
   a back surface grinding step for grinding the back surface of the wafer to a predetermined thickness in a state of a protective member being bonded to the front surface of the wafer;
   a laser beam application step for applying a laser beam capable of passing through a wafer, along the streets formed on the wafer to form a deteriorated layer, the laser beam application step comprising applying the laser beam from the back surface of the wafer; and
   a metal film forming step for forming a metal film on the back surface of the wafer.

8. The method of processing a wafer according to claim 7, which comprises a wafer dividing step for cracking the wafer along the deteriorated layer by giving a stimulus to the wafer in a state of the protective member being bonded to the front surface of the wafer after the laser beam application step.

9. The method of processing a wafer according to claim 7, which comprises a device dividing step for dividing the wafer having a metal film formed on the back surface along the deteriorated layer after the metal film forming step.

* * * * *